United States Patent [19]

Bauer et al.

[11] Patent Number: 5,262,281
[45] Date of Patent: Nov. 16, 1993

[54] RESIST MATERIAL FOR USE IN THICK FILM RESISTS

[75] Inventors: Richard D. Bauer, Kennett Square, Pa.; Gwendyline Y. Y. Chen, Wilmington, Del.; Walter R. Hertler, Kennett Square, Pa.; Robert C. Wheland, Wilmington, Del.

[73] Assignee: E. I. Du Pont de Nemours and Company, Wilmington, Del.

[21] Appl. No.: 847,645

[22] Filed: Mar. 10, 1992

Related U.S. Application Data

[62] Division of Ser. No. 508,136, Apr. 10, 1990, Pat. No. 5,120,633.

[51] Int. Cl.$^5$ .............................. G03F 7/30; G03C 5/58
[52] U.S. Cl. .................................... 430/323; 430/324; 430/326; 430/329; 430/328; 430/312
[58] Field of Search ............... 430/326, 323, 324, 329, 430/312, 280, 270, 328

[56] References Cited

U.S. PATENT DOCUMENTS

| | | | |
|---|---|---|---|
| 3,779,778 | 12/1973 | Smith et al. | 96/115 R |
| 4,356,252 | 10/1982 | Lee | 430/270 |
| 4,491,628 | 1/1985 | Ito et al. | 430/176 |
| 4,985,332 | 1/1991 | Anderson et al. | 430/176 |
| 5,071,731 | 12/1991 | Chen et al. | |
| 5,072,029 | 12/1991 | Hertler | |
| 5,077,174 | 12/1991 | Bauer et al. | |
| 5,145,764 | 9/1992 | Bauer et al. | 430/326 X |

FOREIGN PATENT DOCUMENTS 0264908  4/1988  European Pat. Off.
0342498  11/1989  European Pat. Off.

OTHER PUBLICATIONS

Printed Circuits Handbook, Second Edition, Chap. 6, (1979).
Photoresist Materials and Processes, W. S. DeForest (1975).
J. E. Dearns et al., *J. Macromol. Sci. Chem.*, A8(4), pp. 673–685 (1974).

*Primary Examiner*—Christopher D. Rodee

[57] ABSTRACT

Excellent resolution and sensitivity in the patterning of resists utilized in device and mask manufacture is obtained with a specific composition. In particular this composition involves polymers having recurring pendant acid labile α-alkoxyalkyl carboxylic acid ester and/or hydroxyaromatic ether moieties in the presence of a substance that is an acid generator upon exposure to actinic radiation.

31 Claims, No Drawings

RESIST MATERIAL FOR USE IN THICK FILM RESISTS

This is a divisional U.S. patent application Ser. No. 07/508,136, filed Apr. 10, 1990, now U.S. Pat. No. 5,120,633.

BACKGROUND OF THE INVENTION

1. Field of the Invention

This invention relates to novel photoresist compositions for forming positive resist images on a surface and to circuit fabrication using such novel compositions. The instant composition contains polymers having pendant acid labile groups in the presence of acid generators capable of forming a catalytic amount of strong acid upon exposure to actinic radiation.

2. Background of the Invention

Modern high resolution photoresists require high photospeed for productivity, superior image integrity, and fully aqueous development and stripping. All aqueous processing is needed because the organic solvents that have been used in the past are being replaced because of increasingly demanding environmental restrictions.

In U.S. Pat. No. 3,779,778, novel photosolubilizable compositions are disclosed that comprise 1) a water-insoluble compound containing one or more acid-degradable groups, and 2), a photoinitiator comprising a photolyzable acid progenitor. The useful water-insoluble compounds can contain one or more acid-degradable linkage which can be formed by the nucleophilic reaction of phenols, N-alkyl arylsulfonamides, or certain secondary amines with alkyl vinyl ethers, e.g. methyl vinyl ether, ethyl vinyl ether or a dihydropyran.

A resist prepared according to this invention from the THP ether of a phenolic resin and a photoacid generator required a mixture of flammable organic alcohol, potassium hydroxide and water to develop away the exposed areas.

European Patent Application 0,264,908 discloses resists comprised of at least one polymer, copolymer, or terpolymer having recurrent acid labile groups pendant to the polymer backbone wherein the improvement comprises: selecting a substituent side chain on said acid labile groups which is capable of forming secondary carbonium ion intermediates and having an available proton adjacent to the carbonium ion formed during cleavage. The autodecomposition temperature of the polymer comprising the photoresist is increased, to a temperature greater than about 160° C., by selecting substituent side chains on the acid labile group which exhibit a less stable intermediate carbonium ion than the t-butyl ion.

In U.S. Pat. No. 4,491,628, resists sensitive to UV, electron beam and x-ray radiation with positive or negative tone upon proper choice of a developer are formulated from a polymer having recurrent pendant groups such as tert-butyl ester or tert-butyl carbonate groups that undergo efficient acidolysis with concomitant changes in polarity (solubility) together with a photoinitiator which generates acid upon radiolysis. A sensitizer component that alters wavelength sensitivity of the composition may also be added. The preferred acid labile pendant groups are tert-butyl esters of carboxylic acids and tert-butyl carbonates of phenols but, it is understood that a wide range of acid labile groups are operative in the invention. These include trityl, benzyl, benzhydryl modifications as well as others well known in the art.

These resists require that the exposed image be heated to 100° C. or more to catalytically decompose the acid labile esters in the exposed areas. This heating creates a risk of image distortion if the glass transition of the coating is less than 100° C.

The production of Printed circuits using a variety of resists is described in "Printed Circuits Handbook" edited by Clyde F. Coombs, Second Edition, Published by McGraw-Hill, Inc., 1979. Chapter 6 of this publication describes the use of both negative-working and positive-working photoresists in the preparation of printed circuits. In particular, section 14 of this chapter discusses conventional positive-working liquid photoresists and section 16 discusses conventional coating methods for applying such photoresists to printed circuit substrates. Likewise, the production of printed circuits using photoresists is described in "Photoresist Materials and Processes" by W. S. DeForest published by McGraw-Hill Book Company, 1975. In particular, Chapter 5 of this publication discusses conventional positive resists and the processes of their use to manufacture printed circuits.

The positive acting thick film liquid resist compositions of the current invention are fully aqueous developable, have high photospeed, do not require the use of high temperature bakes to solubilize the exposed image, and give high resolution images of good line quality. Properly formulated, the resist image can withstand both acid and alkaline plating and etching processes used to modify the substrates to which the resists are adhered. The resist image can then be blank exposed and stripped in aqueous alkali or re-exposed imagewise and developed so that the substrate can be modified a second time without the need to apply a second resist.

The resist compositions of the instant invention contain thermally stable but acid labile α-alkoxyalkyl esters of carboxylic acids, e.g., tetrahydropyranyl esters.

J. E. Kearns et al., J. Macromol. Sci.-Chem. A8(4), pp. 673–685 (1974) describe the preparation and deesterification of a number of polymers and copolymers of unsaturated tetrahydropyrany) esters. The utility of dihydropyran as a protecting group in the preparation of polymers containing other groups susceptible to normal hydrolysis conditions is ascribed to the mild conditions required to remove the tetrahydropyranyl group from these esters.

None of the prior art of which we are aware shows the use of the polymers of the present invention in thick film liquid photoresist compositions. Moreover, none of the prior art of which we are aware discloses resist formulations usable in thick film liquid photoresists containing a polymer bearing recurring pendant acid labile groups that possess the structures disclosed in the present invention.

SUMMARY OF THE INVENTION

The invention provides a liquid resist formulation comprising:

(a) a polymer chosen from the group consisting of compositions having a polymer backbone and pendant acid labile groups which are bound directly or indirectly to the polymer backbone, said pendant acid labile groups represented by the formula:

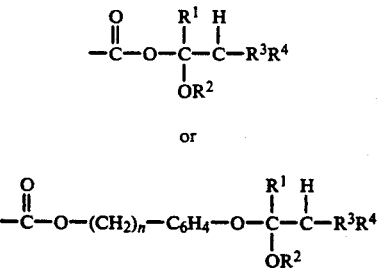

wherein:

n=0–4;

$R^1$ is hydrogen or lower alkyl (alkyl with up to 6 carbon atoms);

$R^2$ is lower alkyl (alkyl with up to 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6- or 7-membered ring, (b) an initiator system comprising an initiator or an initiator and at least one sensitizer, that forms upon exposure to actinic radiation having a wavelength between about 3000Å and about 9000Å, a catalytic amount of a strong acid preferably having a pKa equal to or less than 2; and (c) optionally, additives such as, but not limited to, plasticizers, colorants, adhesion promoters and surfactants, (d) a solvent, said resist composition, subsequent to application to a substrate at a thickness of between 0.2 mils and 5.0 mils and exposure to actinic radiation in an imagewise fashion, capable of developing a latent image without a post exposure elevated temperature treatment and developable to a resist image with essentially all-aqueous alkali developing solutions.

This invention also provides a process for forming a positive resist image on a surface which comprises:

(1) applying a layer of liquid resist composition to said surface, so that the resulting resist film is from 0.2 to 5.0 mils thick, said liquid resist composition comprising:

(a) a polymer chosen from the group consisting of compositions having a polymer backbone and pendant acid labile groups which are bound directly or indirectly to the polymer backbone, said pendant acid labile groups represented by the formula:

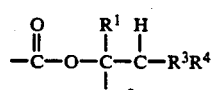

or

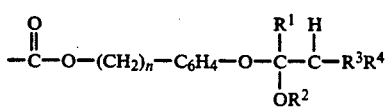

wherein:

n=0–4;

$R^1$ is hydrogen or lower alkyl (alkyl with up to 6 carbon atoms);

$R^2$ is lower alkyl (alkyl with up to 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6- or 7-membered ring, (b) an initiator system comprising an initiator or an initiator and at least one sensitizer, that forms upon exposure to actinic radiation having a wavelength between about 3000Å and about 9000Å, a catalytic amount of a strong acid preferably having a pKa equal to or less than 2; and (c) optionally, additives such as, but not limited to, plasticizers, colorants, adhesion promoters, and surfactants, (d) a solvent, (2) drying said layer to a dry, adherent film, (3) exposing said surface bearing said adherent resist layer, imagewise, to actinic radiation to form an image, (4) developing said latent image to a positive resist image with an essentially all-aqueous alkali developing solution.

A further embodiment of the present invention comprises the above described process with the addition of steps:

(1) permanently modifying the adjacent areas on the substrate surface which are unprotected by the resist image by using a reagent capable of etching said areas or depositing a material on said areas; and (2) blank exposing the resist image and stripping it from the resist in aqueous alkali.

The invention further concerns a process for forming a positive resist on a surface which process comprises:

(1) applying to said surface the surface of a solid, unexposed, photosensitive layer having a thickness of at least 0.2 mils, said layer comprised of (a) a polymer chosen from the group consisting of compositions having a polymer backbone and pendant acid-labile groups which are bound directly or indirectly to the polymer backbone, said pendant acid-labile groups represented by the formula:

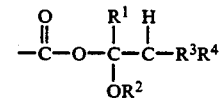

or

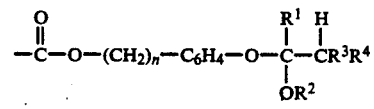

wherein:

n=0–4;

$R^1$ is hydrogen or lower alkyl (up to about 6 carbon atoms);

$R^2$ is lower alkyl (up to about 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6- or 7-membered ring, (b) an initiator system comprising an initiator or an initiator and at least one sensitizer, that forms upon exposure to actinic radiation having a wavelength between about 3000Å and about 9000Å, a catalytic amount of a strong acid preferably having a pKa equal to or less than 2; and (c) optionally additives such as but not limited to, plasticizers, colorants and adhesion promoters, surfactants;

(d) a solvent; (2) drying said layer to a dry, adherent film; (3) exposing the layer, imagewise, to actinic radiation to form an image; (4) washing away the exposed areas of the layer to form a positive resist image; (5) permanently modifying the adjacent areas on the substrate surface which are unprotected by the resist image by using a reagent capable of etching said areas or depositing a material on said areas, and, without the need to apply a second coating of photosensitive material; to form a second latent image;

(6) imagewise exposing the resist layer again (7) washing away the exposed areas of the layer to form a positive resist image;

(8) permanently modifying the adjacent areas on the substrate surface which are unprotected by the resist image by using a reagent capable of etching said areas or depositing a material on said area;

(9) solubilizing the resist and stripping it from the substrate.

The latent image in the above processes can be formed at ambient temperature or after warming to 100° C. or less.

DETAILED DESCRIPTION OF THE INVENTION

This invention is based on the discovery that polymers with pendant acid labile α-alkoxy alkyl esters of carboxylic acids or α-alkoxyalkyl esters of 4-hydroxybenzyl esters can unexpectedly be made into stable high resolution fully aqueous developable liquid thick film photoresists which are capable of withstanding both acid and alkaline processes typically used in the formation of printed circuits.

In order to be developed after exposure, the resists described in the prior art which were based on polymers with pendant α-alkoxyalkyl ethers of phenols required aqueous alkaline solutions containing flammable alcohols. Surprisingly, the resists based on the phenolic α-alkoxyalkyl ethers of 4-hydroxy benzyl esters of the present invention are soluble in all aqueous alkali after exposure.

Finally, the resists of the present invention, when properly formulated, will withstand aqueous acid and alkaline etching and plating processes and even strongly alkaline processes such as electroless copper plating baths, yet they are developable in all aqueous alkali. A subsequent re-exposure and development of the original image to form a second image or a blank re-exposure and development for stripping is still possible.

Polmeric Material

The polymers used in these resists have pendant acid labile groups which are bound directly or indirectly to the polymer backbone. Acrylic, vinyl, polyester, and polyurethane backbones are all possible.

The polymeric materials of the present invention are made by methods known in the art. The polymers can be prepared by free radical polymerization, Group Transfer polymerization, or by other polymerization methods known in the art. The pendant acid labile groups may be selectively attached to the polymer backbone as part of the monomeric components used to form the backbone or after the backbone has been formed. Typically, monomeric components each containing an acid labile group (or sites to which such groups may be later attached) are copolymerized in suitable proportions to produce the polymeric material. Additional conventional monomer components may be incorporated in the copolymerization process to further modify polymeric material characteristics, e.g., to change the hardness, Tg, and the like.

The pendant acid labile groups useful in the compositions of this invention can be described by the formulae:

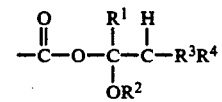

or

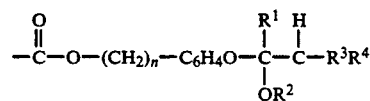

where
  $n = 0-4$;
  $R^1$ is hydrogen or lower alkyl;
  $R^2$ is lower alkyl; and
  $R^3$ and $R^4$ independently are hydrogen or lower alkyl where the definition of lower alkyl includes alkyl groups having 1 to 6 carbon atoms and the joining of $R^1$ and $R^2$, or $R^1$ and either $R^3$ or $R^4$, or $R^2$ and either $R^3$ or $R^4$ to form a 5-, 6-, or 7-membered ring.

Some examples of acid labile monomeric components that fall within the scope of the invention when used to prepare the polymeric material are:
  1-ethoxyethyl methacrylate (or acrylate),
  1-butoxyethyl methacrylate (or acrylate),
  1-ethoxy-1-propyl methacrylate (or acrylate),
  tetrahydropyranyl methacrylate (or acrylate),
  tetrahydropyranyl p-vinylbenzoate,
  1-ethoxy-1-propyl p-vinylbenzoate,
  4-(2-tetrahydropyranyloxy)benzyl methacrylate (or acrylate),
  4-(1-butoxyethoxy)benzyl methacrylate (or acrylate).

Additional conventional monomer components (having no pendant acid labile groups) which may be used to modify the polymeric material include, but are not limited to, acrylic alkyl esters such as methyl methacrylate; ethyl methacrylate; 2-ethyl hexyl methacrylate; propyl methacrylate; cyclohexyl methacrylate; butyl methacrylate; benzyl methacrylate; benzyl acrylate; methyl acrylate; ethyl acrylate; propyl acrylate; butyl acrylate; styrene; acrylic alkyl amides such as N-butylacrylamide; N-octylacrylamide; acrylontirile, styrene, p-methyl styrene; butadiene, isoprene. Preferred monomers for resistance to alkaline processing solutions include aromatic monomers such as styrene or benzyl methacylate or hydrophobic aliphatic monomers such as 2-ethylhexyl, butyl or cyclohexyl methacrylate. Small quantitites (typically less than 5 mole %) of glycidal methacrylate may be added as an adhesion promoter.

Photosensitive Acid Generator

Examples of compounds and mixtures which can be used as photoacid generators include diazonium, phosphonium, sulfonium and iodonium salts; halogen compounds; organometal/organohalogen combinations; benzoin esters and o-nitrobenzyl esters of strong acids, e.g., toluenesulfonic acid; and N-hydroxy amide and N-hydroxyimide sulfonates as disclosed in U.S. Pat. No. 4,371,605. Also included are aryl naphthoquinone-diazide-4-sulfonates. Preferred photosolubilizing agents are the diaryliodonium or triarylsulfonium salts. These are generally present in the form of salts with complex metal halide ions such as tetrafluoroborate, hexafluoroantimonate, hexafluoroarsenate, and hexafluorophosphate.

Another useful group of photosensitive acid generators include oligomers and polymers comprising appended anionic groups having an aromatic onium acid photogenerator as the positive counter ion. Examples of such polymers include those described in U.S. Pat. No. 4,661,429, column 9, lines 1 to 68, and column 10, lines 1 to 14, incorporated herein by reference.

It may be desirable to add a sensitizer to the system to adjust the spectral sensitivity to the available wavelength of actinic radiation. The need will depend on the requirements of the system and the specific photosensitive compound used. For example, iodonium and sulfonium salts that only respond to wavelengths below 300 nm may be sensitized to longer wavelengths using benzophenone and derivatives thereof, polycyclic aromatic hydrocarbons such as perylene, pyrene, and anthracene, and derivatives thereof. The decomposition of diaryliodonium and triarylsulfonium salts has been sensitized by bis-(p-N,N-dimethylaminobenzyliden)-acetone. Anthracene bound sulfonium salts, with chain lengths of three to four atoms, are efficient photosolubilizing agents. These compounds, which are disclosed in M. G. Tilley, Ph.D. Thesis, North Dakota State University, Fargo, ND (1988) [Diss. Abstr. Int. B, 49, 3791 (1989); Chem. Abstr., 111, 39942u], are a preferred class of photosolubilizing agents. Another preferred acid generator is ATASS, i.e., 3-(9-anthracenyl)propyldiphenylsulfonium-, hexafluoroantimonate. In this compound the anthracene and the sulfonium salt are bonded by a three carbon chain. Additional examples of acid generators that may be used herein are diphenyliodium tosylate, benzoin tosylate, and triarylsulfonium hexafluoroantimonate.

The amount of acid generator in the photoresist composition should generally be as low as possible without unduly sacrificing sensitivity, generally from about 0.1% to about 10% by weight of the photoresist composition. Less than about 0.1% generally lead to insensitive compositions while weight percentages greater than 10% produce compatibility and control problems. For most acid-labile polymers, 0.5 to 6% by weight acid generator in the photoresist composition is preferred.

A sufficient amount of acid labile ester in the polymer is necessary to allow the exposed areas of the resist to be developable in all aqueous base either by dissolution or dispersion. Preferred all aqueous developing solutions include, but are not limited to 0.5% sodium hydroxide or 1.0% sodium carbonate. The addition of small amounts of surfactants or defoamers can be useful to aid development or to control foaming in the solution. The exact amount of acid labile ester depends on the resist formulation, the polymer composition and molecular weight, and the glass transition of both. Experiments have demonstrated that as little as 25 mole % of tetrahydropyranyl methacrylate in a tetrahydropyranyl methacrylate/butyl methacrylate copolymer was sufficient for all aqueous development in 0.5% sodium hydroxide solution.

It is possible to add other monomers or additives such as polyketals and acetals, plasticizers and/or crosslinkers into the resist composition to modify certain properties.

Colorants

Colorants such as dyes and pigments are useful adjuvants in dry film photoresists because the developed resist image can be inspected for defects and a determination of when the resist has been cleaned from the substrate during development is possible. A preferred example of a colorant is Victoria Green dye. This material imparts a deep green color to a resist and upon exposure of the resist, it lightens in color in the irradiated areas. This creates an image of the artwork which is useful for inspecting the exposed sample for defects that might have been present in the artwork or dirt that accidentally was present during the exposure. Additives that create a visible image by forming a color or by a color change, e.g., leucolactones, would also be useful.

Printed Circuit Manufacture

Photoresists are used in temporary coatings in a primary imaging process to make printed circuits. In practice, a photoresist layer, typically between 8 and 125 microns thick, is applied to a printed circuit substrate which typically is a copper clad fiberglass epoxy board. The applied photoresist layer is then imagewise exposed to actinic radiation to solubilize exposed areas. The exposed areas are then completely removed typically with a developer solution which selectively dissolves, strips or otherwise disperses the exposed areas without adversely affecting the integrity or adhesion of the unexposed areas. The surface areas of the substrate which were uncovered by the development process are then modified by etching or removing material therefrom or depositing a material thereon.

In the instance of primary imaging to form a printed circuit board, the uncovered copper surface areas may be etched or removed to form a printed circuit directly, or additional copper or other metal resistant to etchant, e.g., gold, tin/lead, etc., may be plated thereover. In the first instance, the unexposed resist is typically removed from the remaining copper surface by a stripping process involving re-exposure to actinic radiation followed by a second development operation to form the circuit board directly. In the second instance, the unexposed resist is first removed from the unplated copper surface which is then etched or removed from the substrate to form a plated printed circuit board.

Liquid Resist Coating and Post-exposure Treatment

The photoresist may be coated as a liquid onto the printed circuit substrate using any conventional coating process. The liquid typically is a solution of the resist wherein the solvent is removed subsequent to coating to form a dry, solid, resist layer. The liquids may be roller-coated, spin-coated as in microelectronic applications, screen-coated or screen-printed as disclosed in Coombs supra, in DeForest supra, or in Oddi et al., U.S. Pat. No. 4,376,815. The solution may also be curtain coated as disclosed in Losert et al., U.S. Pat. No. 4,230,793.

After the resist is formed on the substrate, it is desirable although not essential to prebake the material. This prebake is conveniently performed in the temperature range 70° to 130° C. for periods in the range ½ to 30 min.

The temperature and time period are adjusted to obtain enhanced sensitivity and resolution. For resists of the present invention it is not necessary to bake the exposed resist material after exposure but before development. However temperatures in the range 70° to 100° C. for time periods in the range 0.5 to 5 min can be employed to accelerate the removal of the protecting group, as long as the heating is not detrimental to the integrity of the unexposed resist image.

After exposure and treatment at ambient temperature, the latent image formed in the exposed portion has a different solubility from those portions that were not subjected to actinic radiation. Aqueous-base developers such as 0.25 wt % tetramethylammonium hydroxide in water, or aqueous sodium hydroxide or sodium carbonate are preferred since they avoid typical disposal problems associated with organic solvents and develop the patterns without appreciable swelling.

The resist films of this invention are also useful for preparing lithographic printing plates and the like, similar to those disclosed in Chapter 7 of "Imaging Processes And Materials—Neblette's Eighth Edition" Edited by J. Sturge, V. Walworth and A. Shepp, Van Nostrand Reinhold, (1989), and in Chapter 7 of "Light Sensitive Systems: by J. Kosar, John Wiley & Sons, Inc. (1965).

In the following preparations, gel permeation chromatography (GPC) is used with polystyrene standards for molecular weight measurements. Differential scanning calorimetry is abbreviated DSC. Procedures for carrying out group transfer polymerizations (drying of apparatus, purification of monomers) are as described in Sogah, D. Y.; Hertler, W. R.; Webster, O. W.; Cohen, G. M., *Macromolecules* 1987, 20, 1473.

Preparation of Polymer 1

Poly(tetrahydropyranyl-methacrylate-co-tetrahydropyranyl acrylate)

To 40 mL of ethyl acetate at reflux was added dropwise during 4.5 hr a mixture of 16.6 mL (17 g, 100 mmol) of tetrahydropyranyl methacrylate and 15.6 g (100 mmol) of tetrahydropyranyl acrylate, while simultaneously adding a solution of 30 mg of VAZO 52 in 6 mL of ethyl acetate during 6 hr. During this period the solution became quite viscous. NMR analysis of the reaction mixture showed about 27% of residual arylate monomer. The polymer was precipitated in methanol at −78° C. in a blender to give, after drying at 0.1 mm for 24 hr, 24 g of poly(tetrahydropyranyl methacrylateco-tetrahydropyranyl acrylate). NMR analysis showed the composition to be 59 mole % tetrahydropyranyl methacrylate, 41 mole % tetrahydropyranyl acrylate. GPC: $\overline{M}_n=58,900$, $\overline{M}_w=126,000$, $\overline{M}_w/\overline{M}_n=2.15$. Tg=74°.

Preparation of Polymer 2

Poly(benzyl methacrylate [50 mol %], tetrahydropyranyl methacrylate [50 mol %])

Tetrahydropyranyl methacrylate (THPMA) and benzyl methacrylate were separately purified by passage over a column of basic alumina under an argon atmosphere. To a stirred solution of 1.79 mL (5.6 mmol) of 1-(2-trimethylsiloxyethoxy)-1-trimethylsiloxy-2-methyl-1-propene and 0.121 mL of tetrabutylammonium biacetate (0.04 M in tetrahydrofuran) in 180 mL of tetrahydrofuran (THF) was added a mixture of 61.4 g (60.3 mL, 0.35 mol) of benzyl methacrylate and 59.5 g (58.3 mL, 0.35 mol) of tetrahydropyranyl methacrylate at a rate such that the temperature remained near 36° C. When the temperature had returned to room temperature, NMR analysis of an aliquot of the reaction mixture showed that no residual monomer was present. The product was precipitated in methanol and dried at 0.1 mm (25° C.) to give 120 g of poly(THPMA, benzyl methacrylate). NMR analysis showed the copolymer to consist of 50 mole % THPMA units and 5 mole % benzyl methacrylate units. Gel permeation chromatography (GPC): $\overline{M}_n=20,100$, $\overline{M}_w=22,600$, $\overline{M}_w/\overline{M}_n=1.12$. Differential scanning calorimetry (DSC): $T_g=96.8°$ C. with a decomposition endotherm at 184.7° C.

Polymer 3

Phenolic Novolak Resin HRJ 1829, Novolak for flexible photoresist, mP 140° C. obtained from Schenectady Chemicals, Inc., Schenectady, N.Y.

Preparation of Polymer 4

Tetrahydropyranyl Ether of Novolak HRJ 1829

A mixture of 5.09 g of Novolak HRJ-1829, 20 mL of 3,4-dihydro-2H-pyran, and 0.1 g of pyridine hydrochloride was stirred at reflux for 18 hr. Then 1 g of crosslinked poly(dimethylaminomethylstyrene) was added, and the mixture was stirred for 1 hr and filtered. Precipitation of the product from the filtrate with methanol gave, after drying in vacuo at room temperature, 6.5 g of tetrahydro-2-pyranyl ether of Novolak resin. $^1$H NMR (300 MHz) shows a resonance at δ 5.35 ppm characteristic of the methine proton of a tetrahydropyranyl ether. DSC: $T_g$ 60.8° C. with decomposition endotherm at 148.09° C. (335.6 J/g). TGA shows 29.45% weight loss at 161.95° C.

Preparation of Polymer 5

Poly(4-tetrahydropyranyloxybenzyl methacrylate)

To a solution of 0.64 mL (2 mmol) of 1-(2-trimethylsiloxyethoxy)-1-trimethylsiloxy-2-methyl-1-propene, 0.55 mL of tetrabutylammonium biacetate (0.04 M in THF), and 0.06 mL of bis(dimethylamino)methylsilane in 40 mL of THF was added dropwise a solution of 20 g (72.5 mmol) of 4-tetrahydropyranyloxybenzyl methacrylate (purified by passing over a column of basic alumina in hexane solution, followed by evaporation of the hexane under reduced pressure) in 30 mL of THF. When the exothermic polymerization was finished, and the temperature had returned to room temperature, the reaction mixture was poured into methanol. Filtration gave 19 g of poly(4-tetrahydropyranyloxybenzyl methacrylate). GPD: $\overline{M}_n=9390$, $\overline{M}_w=11,500$, $\overline{M}_w\overline{M}_n=1.23$. DSC: $T_g=62.3°$ C., with a decomposition endotherm at 250.5° C. TGA: rapid loss of 24.74% of weight at 248.1° C. The monomer was prepared from methyl 4-hydroxybenzoate by reaction with an excess of 3,4-dihydro-2H-pyran in the presence of sulfuric acid catalyst to give methyl 4-(2-tetrahydropyranyloxy)benzoate, which was then reduced with lithium aluminum hydride in THF solution to give 4-(2-tetrahydropyranyloxy)benzyl alcohol. Esterification with methacrylyl chloride and triethylamine in dichloromethane solution gave 4-tetrahydropyranyloxybenzyl methacrylate, m.p. 36° C.

Preparation of Polymer 6

Poly(n-butyl methacrylate (78 mole %) THPMA (22 mole %))

Tetrahydropyranyl methacrylate (THPMA) and n-butyl methacrylate were purified separately by passage over a column of basic alumina under argon. To a solution of 1.48 mL (5 mmol) of 1-(2-trimethylsiloxyethoxy)-1-trimethylsiloxy-2-methyl-1-propene and 0.1 mL of tetrabutylammonium biacetate (0.04 M in THF) in 150 mL of THF under an argon atmosphere was added a mixture of 64.1 g (7.17 mL, 0.45 mol), of n-butyl methacrylate and 21.6 g (21.2 mL, 0.127 mol) of THPMA at a rate such that the temperature of the reaction remained between 35 and 40° C. NMR analysis of the reaction mixture showed no residual monomer. Precipitation in methanol gave an oil, which after drying at 0.1 mm, solidified to 60 g of poly(n-butyl methacrylate [78 mol %], THPMA [22 mol %]). GPC: $\overline{M}_n = 19,600$, $\overline{M}_w = 20,800$, $\overline{M}_w/\overline{M}_n = 1.11$. DSC: $T_g = 49.2°$ C.

Procedure for Treatment of Copper Clad Panels with Benzotriazole

A solution was prepared comprising 385 grams of deionized water, 47.5 grams of 37% hydrochloric acid, and 47.5 grams of benzotriazole. A working solution was prepared by mixing one part of this solution to 9 parts of deionized water.

The copper clad glass epoxy panels were scrubbed and dried. They were dipped for 15 seconds into the working benzotriazole solution, rinsed for 30 seconds in a stream of deionized water, and dried in oil free air. The panels are then ready to laminate with resist.

EXAMPLE 1

A photoresist coating solution was prepared from 1.7 g of a tetrahydropyranyl acrylate/-tetrahydropyranyl methacrylate (41:59) copolymer (Polymer #1), 0.1 g of Union Carbide UVI 6974 (a 50% solution of mixed salts of triaryl sulfonium hexafluoroantimonate), 0.01 g of chlorothioxanthone, 0.04 g of benzophenone and 3 g of 2-methoxy propane (containing 0.033% Victoria Green dye). The solution was coated onto a scrubbed copper clad glass epoxy panel, air dried, and completely dried in a 40° C. oven for 15 minutes to give a coating one mil thick. On a sample of the coated panel separate areas were given to exposures of 25, 50, 100, 200 and 400 mj/cm² using a Du Pont PC 130 printer (containing a 5000 W high pressure mercury lamp). The exposure energy incident upon the samples was checked with an IL 770 radiometer which integrated energy between 300 and 400 nanometers. The sample was held 15 minutes at room temperature, and passed through a 0.5% aqueous sodium hydroxide solution at 105° F. in an ASI spray developer unit at 30 psi. The exposures at 100 mj/cm² and higher allowed clean development of the resist in 25 seconds (as determined by the frosty salmon color of the bare copper after a brief dip in acidic ammonium persulfate solution). Another sample was exposed imagewise through a UGRA Plate Control Wedge 1982 containing concentric circles spaced from 4 to 70 microns (available from the Graphic Arts Technical Foundation) at 100 mj/cm². After exposure a bleach image of the artwork remained in the sample. After development it held and resolved 25 micron lines and spaces and the developed line edges of the image were even and well formed.

EXAMPLE 2

A photoresist coating solution was prepared from 1.33 g of a benzyl methacrylate/tetrahydropyranyl methacrylate (50:50) copolymer (Polymer #2), 0.1 g of Union Carbide UVI 6974, 0.01 g of chlorothioxanthone, 0.41 g of benzophenone and 3 g of 2-methoxy propane (containing 0.033% Victoria Green dye). The solution was coated onto scrubbed copper clad glass epoxy panel, air dried, and completely dried in a 40° C. oven for 15 minutes to give a coating one mil thick. On a sample of the coated panel separate areas were given to exposures of 25, 50, 100, 200, and 400 mj/cm². The exposures were held 15 minutes at room temperature, and developed at 105° F. in 0.5% sodium hydroxide in the ASI as previously described. Resist areas given 100 mj/cm² exposure and higher developed clean in 70 seconds. An imaged sample exposed at 100 mj/cm² and processed in the same way held and resolved 55 micron lines and spaces and the developed edges of the image were even and well formed.

After storing the panel coated with the resist in the dark for 46 days, another sample was exposed imagewise at 100 mj, held 30 minutes, developed and lightly etched in persulfate to give a residue free image which held and resolved 55 micron lines and spaces and had even well formed line edges. On a portion of this imaged sample which had not been irradiated during the first exposure there was placed a second imagewise exposure at 100 mj through the same artwork. After development and a light etch, this image held and resolved 55 micron lines and spaces and had good line edges.

A sample of this resist on scrubbed copper which had been stored in the dark for 11 months was given a 750 mj/cm² exposure, held for about 1 hour, and stripped from the panel using a 50/50 mixture of DI water and Shipley Microposit® 351 developer (the Material Safety Data Sheet indicates that this is essentially a 5% sodium hydroxide solution).

Comparative Example 3

This example demonstrates the need to heat resist coatings containing poly(t-butyl methacrylate) in order to get a developed image. The line edges on these images were uneven and ragged.

A photoresist coating solution was prepared from 1.5 g of poly(t-butyl methacrylate), 0.1 g of Union Carbide UVI 6974, 0.002 g of chlorothioxanthone, 0.24 g of benzophenone and 3 g of methyl ethyl ketone (containing 0.033% Victoria Green dye). The solution was coated onto a panel of scrubbed copper clad epoxy laminate with a six mil doctor blade, air dried, and further dried in a 40° C. oven for 15 minutes to give a coating one mil thick. An exposure of 600 mj/cm² followed by heating at 100° C. for 15 minutes allowed this resist to be developed clean in 150 seconds under the conditions previously cited. The edges of isolated lines on an imaged sample produced under these conditions were uneven and ragged.

Comparative Example 4

Three photoresist coating solutions 4A, 4B and 4C were prepared with the ingredients listed below. Polymers 5 and 6 are included for comparison. Polymer 7 is within the invention:

|  | 4A | 4B | 4C |
|---|---|---|---|
| Polymer #3 [Novolak Resin HRJ1829] | 1.5 g | | |
| Polymer #4 [THP derivative of HRJ1829] | | 1.5 g | |
| Polymer #5 [poly-(4-(2-THPoxy)-benzylMA)] | | | 1.5 g |
| Cyracure 6974 | 0.1 g | 0.1 g | 0.1 g |
| Chlorothioxanthone | 0.002 g | 0.002 g | 0.002 g |
| Benzophenone | 0.24 g | 0.24 g | 0 24 g |
| Dibutyl phthalate | 0.2 g | 0.2 g | 0.2 g |
| Victoria Green Dye | 0.001 g | 0.001 g | 0.001 g |
| Methylethylketone | 3.0 g | 3.0 g | 3.0 g |

Liquid Coating

Solution 4A was coated onto a Piece of scrubbed copper clad glass epoxy with a six mil doctor blade, air dried, and fully dried in a 40° C. oven for 15 minutes to give a coating one mil thick. A sample was passed through the ASI developer unit with 0.5% sodium hydroxide at 105° F., but the coating would not wash clean after 10 minutes. Another sample was dipped into a stirred beaker with a 50/50 vol/vol solution of Shipley Microposit ® 351 (essentially 5% sodium hydroxide) and DI water at 105° F. The coating developed from the panel in 60 seconds. A third sample developed clean in 19 seconds when placed in a semi-aqueous developer solution at 105° F. comprising 70 grams of n-propyl alcohol, 128 grams of water, and 2 grams of potassium hydroxide.

Dry Film Resist

A second sample of HRJ1829 was converted to its tetrahydropyranyl ester derivative using dihydropyran (Polymer #6). A coating solution 4B was prepared identical to 4A, except that the tetrahydropyranyl derivative replaced the HRJ1829 polymer; the solution was coated onto one mil polyester with a six mil doctor blade and air dried to give a one mil thick dry film resist. This photosensitive coating was laminated onto scrubbed and treated copper clad epoxy laminate with a hot roll laminator. Samples of the coating were given separate exposures of 100, 200, 400 and 800 mj/cm² and held for thirty minutes. During the hold time they received different heat treatments as listed in the table below. The samples were immersed in all aqueous and semi-aqueous developer until the resist cleaned from the copper or for a maximum of 5 minutes. Note that this resist would only develop in semi-aqueous developer and then only after extensive heating.

| Developer/ Temp | Hold Temp Time | 100 mj/cm² | 200 mj/cm² | 400 mj/cm² | 800 mj/cm² |
|---|---|---|---|---|---|
| 351/H₂O 50/50 105° F. | RT | DNC | sl. dev | heavy residue | heavy residue |
|  | 100° C./ 5 min. | DNC | sl. dev | heavy residue | heavy residue |
|  | 100° C./ 15 min. | DNC | DNC | heavy residue | heavy residue |
| Semi-aqueous 105° C. | RT | DNC | heavy residue | heavy residue | heavy residue |
|  | 100° C./ 5 min. | DNC | heavy residue | heavy residue | heavy residue |
|  | 100° C./ 15 min | DNC | scum | 210 sec | 45 sec |

Two samples of coating 4B were imagewise exposed through the UGRA artwork at 400 and 800 mj/cm², held 15 minutes, heated for 15 minutes at 100° C., and develop in the semi-aqueous developer at 105° F. The images developed cleanly, but the line edges were ragged and uneven.

Liquid Resist

For comparison, resist solution 4C was coated onto a piece of scrubbed copper clad glass epoxy, air dried, and then heated in a 40° C. oven for 15 minutes to give a green resist coating about one mil thick.

A sample of this coated panel was imaged through a UGRA target with 410 mj/cm² and held 30 minutes. After exposure the panel had a bleach image of the artwork. The panel was developed in a 50/50 by weight mixture of DI water and Shipley Microposit ® 351 developer for 17 seconds followed by a light etch in ammonium persulfate. The image held and resolved 55 micron lines and spaces.

EXAMPLE 5

Two photoresist solutions were prepared with the ingredients listed below.

|  | A | B |
|---|---|---|
| Polymer #6 | 1.7 | |
| Polymer #1 | | 1.5 |
| Benzophenone | 0.04 | 0.24 |
| Chlorothioxanthone | 0.01 | 0.002 |
| UVI6974 | 0.1 | 0.1 |
| Victoria Green Dye | 0.001 | 0.001 |
| 2-methoxypropane | 3.0 | 3.0 |

Resist solutions A and B were coated directly onto scrubbed and benzotriazole treated copper clad laminate with a six mil knife and dried to give a one mil coating. Imagewise exposure of resist A at 400 mj/cm² through a UGRA target gave a bleach-out image of the artwork. After holding at room temperature for 30 minutes, development as in Example 1 for 520 seconds and lightly etching in sodium persulfate gave a resist image which held and resolved 70 micron lines and spaces. This sample was placed in a PCK-570 full build electroless copper bath for 5 hours, over which time the bath was replenished with formaldehyde and sodium hydroxide as needed to keep the bath actively depositing electroless copper on those areas of the sample where the resist had been developed away. The resist image remained green and still adhered during that time, although the line edges were attached slightly.

Imagewise exposure of coated and dried resist B at 100 mj/cm² also gave a bleach image of the UGRA target. After holding for 30 minutes the sample was developed as in Example 1 in 60 seconds and lightly etched in sodium Persulfate. The image held and resolved 30 micron lines and spaces and had good line edges.

The copper uncovered by development was etched away with persulfate. The remaining resist image was given a blank 750 mj/cm² exposure and stripped away using a 50/50 mixture of DI water and Shipley Microposit ® 351 developer at 40° C.

Another sample was placed in a PCK-570 full build electroless bath for 6 ½ hours. The resist remained green and firmly adhered to the copper substrate. After having been stored away for 10 months in the dark, this sample was given a 750 mj/cm² exposure, held 30 minutes, and then stripped of resist in the 50/50 Shipley developer.

EXAMPLE 6

A liquid resist composition was prepared as by dissolving 0.9 grams of a benzyl methacrylate/tetrahydropyranyl methacrylate copolymer (Polymer #2), 0.5 grams of Epon 835 (a difunctional bisphenol-type epoxide crosslinker, epoxide equivalent-weight approximately 190, manufactured by Shell Chemical Company), 0.01 grams of chlorothioxanthone, 0.04 grams of benzophenone, and 0.1 grams of UVI6974 in 3 grams of methyl ethyl ketone. This liquid resist coating was coated onto a piece of scrubbed copper clad glass epoxy with a 3 mil doctor knife and air dried. The sample was exposed imagewise through a line/space target for 30 seconds in a PC-130, held for about 5 minutes, and then developed in 260 seconds using a spray of 0.25 N aqueous tetramethylammoniumhydroxyde (TMAH) at room temperature. The sample was lightly etched with sodium persulfate to determine that development was complete in the exposed line areas. Another sample exposed for 40 seconds could be developed in 300 seconds on the ASI spray developer with 0.5% sodium hydroxide at 105° F.

In order to determine if there was a usable window in which the sample could still be developed before becoming insolubilized by crosslinking, two samples were imagewise exposed for 40 seconds. On was developed immediately in 0.25 N TMAH at 300 seconds and lightly etched with persulfate. Within the image 5 mil lines were resolved. The other sample was held for one hour and then was developed for 330 seconds in the TMAH followed by a light persulfate etch. Within the image 5 mil lines were resolved. The window was at least one hour. Another imaged and developed sample was blank exposed for 60 seconds to crosslink it. In order to test how effectively the resist could be crosslinked, small samples were flood exposed for 60 seconds and placed in a 100° C. oven for increasing lengths of time. The time to strip the coating from the copper surface using methylene chloride was measured.

| Time in Oven | Time to Strip |
|---|---|
| 0 min | 21 seconds |
| 1 min | 28 seconds |
| 5 min | 38 seconds |
| 10 min | 5 minutes, starting to peel |
| 20 min | 10 minutes, starting to peel |
| 40 min | blistering in 8 minutes, but still adhering at 18 minutes |

As many differing embodiments of this invention may be made without departing from the spirit and scope thereof, it is to be understood that this invention is not limited to the specific embodiments exemplified except as defined by the appended claims.

What is claimed is:

1. A process for forming a positive resist image on a surface comprising the steps of:
   (1) applying a layer of liquid resist composition to said surface, so that the resulting resist film is from about 2.0 to 5.0 mils thick, said liquid resist composition comprising:
      (a) a polymer chosen from the group consisting of compounds having a polymer backbone and pendant acid labile groups which are bound directly or indirectly to the polymer backbone, said pendant acid labile groups represented by the formula:

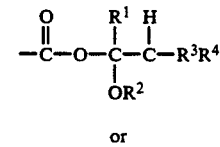

or

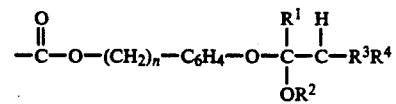

wherein:
   $n = 0-4$;
   $R^1$ is hydrogen or a $C_1-C_6$ lower alkyl;
   $R^2$ is a $C_1-C_6$ lower alkyl; and
   $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6- or 7-membered ring,
   (b) an initiator system comprising an initiator or an initiator and at least one sensitizer that generates, upon exposure to actinic radiation having a wavelength between about 3000 Å and about 9000 Å, a catalytic amount of a strong acid,
   (c) a solvent,
(2) drying said layer to a dry, adherent film,
(3) exposing said surface bearing said adherent resist layer, imagewise, to actinic radiation to form an image,
(4) developing said latent image to a positive resist image with an essentially all-aqueous alkali developing solution.

2. The process of claim 1 wherein the photosensitive layer contains a plasticizer.

3. The process of claim 1 wherein the photosensitive layer contains a colorant.

4. The process of claim 1 wherein the photosensitive layer contains an adhesion promoter.

5. The process of claim 1 wherein the photosensitive layer contains a surfactant.

6. The process of claim 1 wherein the polymer is selected form the group consisting of a homopolymer, copolymer, terpolymer and block polymer.

7. The process of claim 6 wherein the polymer is a copolymer of benzyl methacrylate and tetrahydropyranyl methacrylate.

8. The process of claim 6 wherein an acid labile monomer used to form said polymer is selected from the group consisting of:
   1-ethoxyethyl methacrylate,
   1-ethoxyethyl acrylate,
   1-butoxyethyl methacrylate,
   1-butoxyethyl acrylate,
   1-ethoxy-1-propyl methacrylate,
   1-ethoxy-2-propyl acrylate,
   tetrahydropyranyl methacrylate,
   tetrahydropyranyl acrylate,
   tetrahydropyranyl p-vinylbenzoate,
   1-ethoxy-1-propyl p-vinylbenzoate,
   4-(2-tetrahydropyranyloxy)benzyl methacrylate,
   4-(2-tetrahydropyranyloxy)benzyl acrylate,
   4-(1-butoxyethoxy)benzyl methacrylate, and
   4-(1-butoxyethoxy)benzyl acrylate.

9. The process of claim 6 wherein the polymer contains one or more comonomers having no pendant acid-labile groups.

10. The process of claim 9 wherein the comonomer having no pendant acid-labile groups is selected form the group consisting of: methyl methacrylate, butyl methacrylate, benzyl methacrylate, benzyl acrylate, styrene, 2-ethylhexyl methacrylate and cyclohexyl methacrylate.

11. The process of claim 6 wherein the polymer is prepared by group transfer polymerization.

12. The process of claim 6 wherein the polymer is prepared by free radical polymerization.

13. The process of claim 6 wherein the initiator system contains an acid generator selected form the group consisting of diazonium, phosphonium, sulfonium, iodonium salts, halogen compounds, organometal/organohalogen combinations, benzoin esters and o-nitrobenzyl esters of strong acids, and N-hydroxyamide and N-hydroxyimide sulfonates, and aryl naphthoquinonediazide-4-sulfonates.

14. The process of claim 6 wherein the acid generator comprises about 0.1% to about 10% by weight of the photoresist composition.

15. The process of claim 1 including the additional steps of:
   (1) permanently modifying the areas on the substrate surface which are unprotected by the resist image by using a reagent capable of etching said areas or depositing a material on said areas;
   (2) blank exposing the resist image; and
   (3) stripping the exposed resist image from the resist in aqueous alkali.

16. The process of claim 1 wherein a crosslinker is added to the liquid resist composition in step (1).

17. The process of claim 16 wherein the crosslinker is a difunctional epoxide.

18. A process for forming a positive resist on a surface which process comprises:
   (1) applying to said surface the surface of a solid, unexposed, photosensitive layer having a thickness of at least 0.3 mils, said layer comprised of
      (a) a polymer chosen from the group consisting of compounds having a polymer backbone and pendant acid-labile groups which are bound directly or indirectly to the polymer backbone, said pendant acid-labile groups represented by the formula:

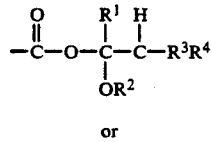

or

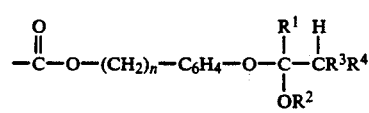

wherein:
n=0–4;
R¹ is hydrogen or lower alkyl up to about 6 carbon atoms;
R² is lower alkyl up to about 6 carbon atoms; and
R³ and R⁴ independently are hydrogen or lower alkyl where the definition of lower alkyl includes the joining of R¹ and R² or R¹ and either R³ or R⁴, or R² and either R³ or R⁴ to form a 5-, 6- or 7-membered ring,
      (b) an initiator system comprising an initiator or an initiator and at least one sensitizer, that generates, upon exposure to actinic radiation having a wavelength between about 3000 Å to about 9000 Å, a catalytic amount of a strong acid,
      (c) optionally, plasticizers, colorants and adhesion promoters, surfactants,
   (2) exposing the layer, imagewise, to actinic radiation to form an image;
   (3) washing sway the exposed areas of the layer to form a positive resist image;
   (4) permanently modifying the areas on the substrate surface which are unprotected by the resist image by using a reagent capable of etching said areas or depositing a material on said areas, and, without the need to apply a second coating of photosensitive material;
   (5) imagewise exposing the resist layer to form a second latent image;
   (6) washing away the exposed areas of the layer to form a positive resist image;
   (7) permanently modifying the areas on the substrate surface which are unprotected by the resist image by using a reagent capable of etching said areas or depositing a material on said area;
   (8) solubilizing the resist and stripping it from the substrate.

19. The process of claim 18 wherein the photosensitive layer contains a plasticizer.

20. The process of claim 18 wherein the photosensitive layer contains a colorant.

21. The process of claim 18 wherein the photosensitive layer contains an adhesion promoter.

22. The process of claim 18 wherein the photosensitive layer contains a surfactant.

23. The process of claim 18 wherein the polymer is selected from the group consisting of a homopolymer, copolymer, terpolymer and block polymer.

24. The process of claim 23 wherein the polymer is a copolymer benzyl methacrylate and tetrahydropyranyl methacrylate.

25. The process of claim 23 wherein a monomer used to form said polymer is selected from the group consisting of:
1-ethoxyethyl methacrylate,
1-ethoxyethyl acrylate,
1-butoxyethyl methacrylate,
1-butoxyethyl acrylate,
1-ethoxy-1-propyl methacrylate,
1-ethoxy-2-propyl acrylate,
tetrahydropyranyl methacrylate,
tetrahydropyranyl acrylate,
tetrahydropyranyl p-vinylbenzoate,
1-ethoxy-1-propyl p-vinylbenzoate,
4-(2-tetrahydropyranyloxy)benzyl methacrylate,
4-(2-tetrahydropyranyloxy)benzyl acrylate,
4-(1-butoxyethoxy)benzyl methacrylate, and
4-(1-butoxyethoxy)benzyl acrylate.

26. The process of claim 18 wherein the polymer contains one or more comonomers having no pendant acid-labile groups.

27. The process of claim 26 wherein the comonomer having no pendant acid-labile groups is selected form the group consisting of: methyl methacrylate, butyl methacrylate, benzyl methacrylate, benzyl acrylate, styrene, 2-ethylhexyl methacrylate and cyclohexyl methacrylate.

28. The process of claim 18 wherein the polymer is prepared by group transfer polymerization.

29. The process of claim 18 wherein the polymer is prepared by free radical polymerization.

30. The process of claim 18 wherein the initiator system contains an acid generator selected from the group consisting of diazonium, phosphonium, sulfonium, iodonium salts, halogen compounds, organometal/organhalogen combinations, benzoin esters and o-nitrobenzyl esters of strong acids, and N-hydroxyamide and N-hydroxyimide sulfonates, and aryl naphthoquinonediazide-4-sulfonates.

31. The process of claim 18 wherein the acid generator comprises about 0.1% to about 10% by weight of the photoresist composition.

* * * * *